United States Patent
Lagally et al.

(10) Patent No.: US 9,472,535 B2
(45) Date of Patent: Oct. 18, 2016

(54) STRAIN TUNABLE LIGHT EMITTING DIODES WITH GERMANIUM P-I-N HETEROJUNCTIONS

(71) Applicant: Wisconsin Alumni Research Foundation, Madison, WI (US)

(72) Inventors: Max G. Lagally, Madison, WI (US); José Roberto Sánchez Pérez, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/074,955

(22) Filed: Nov. 8, 2013

(65) Prior Publication Data

US 2015/0129911 A1 May 14, 2015

(51) Int. Cl.
*H01L 25/16* (2006.01)
*H01L 31/028* (2006.01)

(52) U.S. Cl.
CPC ........... *H01L 25/167* (2013.01); *H01L 31/028* (2013.01); *H01L 2924/0002* (2013.01)

(58) Field of Classification Search
CPC ............................. H01L 33/34; H01L 28/028
USPC ......................................................... 257/458
See application file for complete search history.

(56) References Cited

U.S. PATENT DOCUMENTS

| 6,858,888 | B2 | 2/2005 | Lal et al. |
| 7,229,901 | B2 | 6/2007 | Savage et al. |
| 7,777,290 | B2 | 8/2010 | Lagally et al. |
| 7,973,336 | B2 | 7/2011 | Savage et al. |
| 2007/0170536 | A1* | 7/2007 | Hsu et al. ........................ 257/458 |
| 2010/0290217 | A1* | 11/2010 | Anantram et al. ............ 362/159 |
| 2013/0039664 | A1 | 2/2013 | Clifton et al. |

OTHER PUBLICATIONS

Kim et al., Stretchable and Foldable Silicon Integrated Circuits, Science, vol. 320, Mar. 27, 2008, pp. 507-511.
Lim et al., Enhanced direct bandgap emission in germanium by micromechanical strain engineering, Optics Express, vol. 17, No. 18, Aug. 31, 2009, pp. 16358-16365.
Nam et al., Strained germanium thin film membrane on silicon substrate for optoelectronics, Optics Express, vol. 19, No. 27, Dec. 5, 2011, pp. 25866-25872.
Cheng et al., Strain-enhanced photoluminescence from Ge direct transition, Appl. Phys. Lett., vol. 96, No. 211108, May 24, 2010, pp. 1-3.
Sánchez-Pérez et al., Direct-bandgap light-emitting germanium in tensilely strained nanomembranes, PNAS, vol. 108 No. 47, Nov. 22, 2011, pp. 18893-18898.
El Kurdi et al., Control of direct band gap emission of bulk germanium by mechanical tensile strain, Appl. Phys. Lett., vol. 96, No. 041909, Jan. 28, 2010, pp. 1-3.

(Continued)

*Primary Examiner* — Thao X Le
*Assistant Examiner* — J. R. Oakley
(74) *Attorney, Agent, or Firm* — Bell & Manning, LLC

(57) ABSTRACT

Tunable p-i-n diodes comprising Ge heterojunction structures are provided. Also provided are methods for making and using the tunable p-i-n diodes. Tunability is provided by adjusting the tensile strain in the p-i-n heterojunction structure, which enables the diodes to emit radiation over a range of wavelengths.

12 Claims, 4 Drawing Sheets

(56) References Cited

OTHER PUBLICATIONS

Bortug et al., Tensilely Strained Germanium Nanomembranes as Infrared Optical Gain Media, Small, vol. 9, No. 4, Nov. 2, 2012, pp. 622-630.
Nataraj et al., Direct-bandgap luminescence at room-temperature from highly strained Germanium nanocyrstals, Otics Express, vol. 18, No. 7, Mar. 23, 2010, pp. 7085-7091.
Yuan et al., Flexible photodetectors on plastic substrates by use of printing transferred single-crystal germanium membranes, Appl. Phys. Lett., vol. 94, No. 013102, Jan. 6, 2009, pp. 1-3.
Camacho-Aguilera et al., An electrically pumped germanium laser, Optics Express, vol. 20, No. 10, May 2, 2012, pp. 11316-11320.
Kasper et al., Room Temperature Direct Band Gap Emission from Ge p-i-n. Heterojunction Photodiodes, Advances in OptoElectronics, vol. 20125, Article ID 916275, 2012, pp. 1-4.
Danilova et al., Light-Emitting Diodes Based on GaSb Alloys for the 1.6-4.4 μm Mid-Infrared Spectral Range, Semiconductors, vol. 39, No. 11, 2005, 1235-1266.
Maisons et al., Substrate emitting index coupled quantum cascade lasers using biperiodic top metal grating, Appl. Phys. Lett., vol. 94, No. 151104, Apr. 14, 2009, pp. 1-3.
Nam et al., Electroluminescence from strained germanium membranes and implications for an efficient Si-compatible laser, Appl. Phys. Lett., vol. 100, No. 131112, Mar. 27, 2012, pp. 1-4.
Qin et al., Impact of strain on radio frequency characteristics of flexible microwave single-crystalline silicon nanomembrane p-intrinsic-n diodes on plastic substrates, Appl. Phys. Lett., vol. 97, No. 233110, Dec. 9, 2010, pp. 1-3.

* cited by examiner

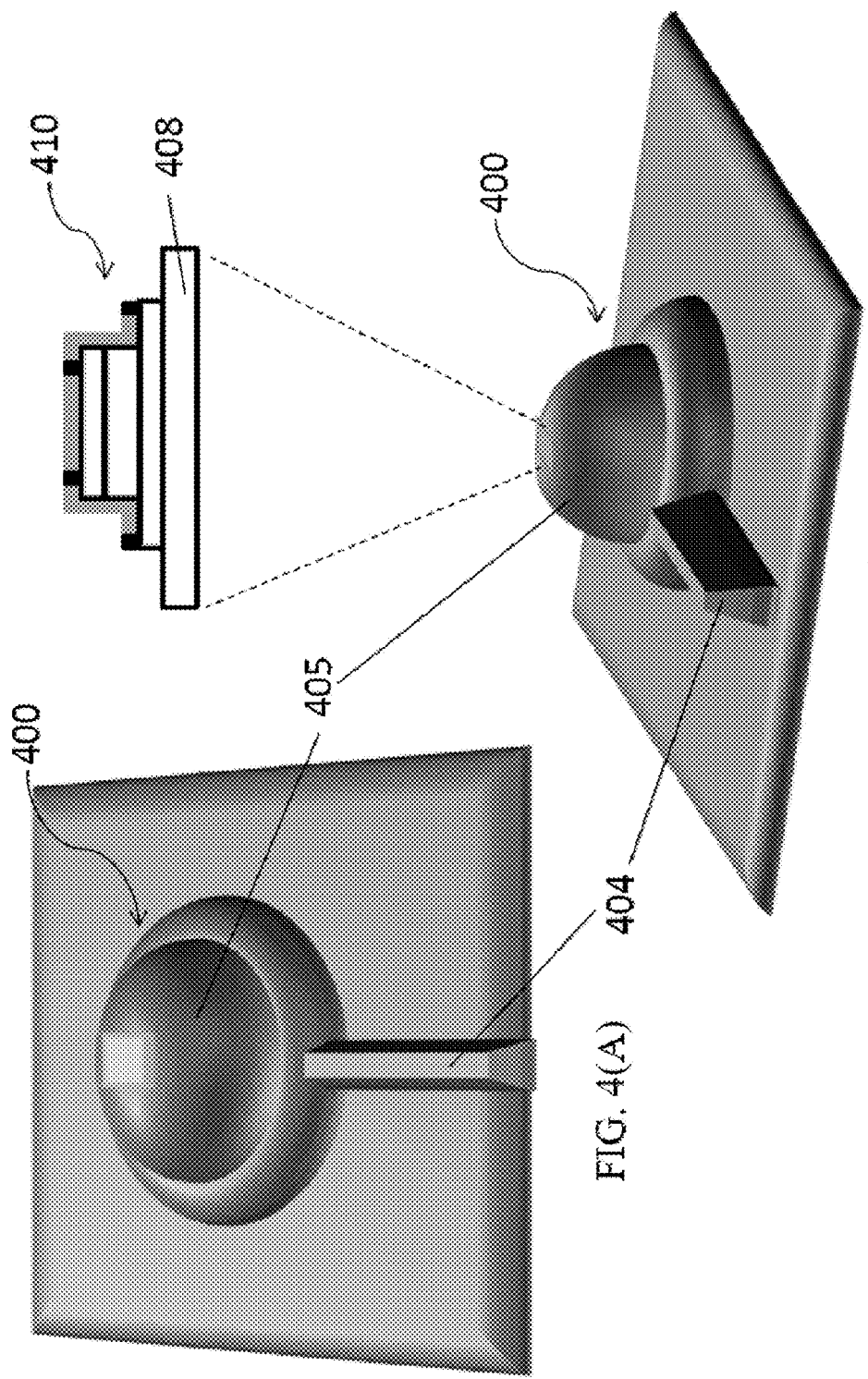

US 9,472,535 B2

STRAIN TUNABLE LIGHT EMITTING DIODES WITH GERMANIUM P-I-N HETEROJUNCTIONS

REFERENCE TO GOVERNMENT RIGHTS

This invention was made with government support under DE-FG02-03ER46028 awarded by the Department of Energy. The government has certain rights in the invention.

BACKGROUND

Germanium, a group-IV semiconductor material, offers a wide range of established and potential technological applications of high relevance and impact. In optoelectronics, Ge has been used as a photodetector material for use in on-chip data distribution, thanks to its strong interband absorption at near-infrared optical communication wavelengths, and again to its direct compatibility with the Si microelectronics platform. Additional device applications within the emerging field of group-IV photonics, including lasers and solar cells, have also been investigated.

SUMMARY

Tunable p-i-n diodes comprising Ge heterojunction structures are provided. Also provided are methods for making and using the tunable p-i-n diodes.

One embodiment of a tunable p-i-n diode comprises: a mechanically stretchable substrate; a p-i-n heterojunction structure affixed to the mechanically stretchable substrate, the p-i-n heterojunction structure comprising a layer of n-type doped Ge, a layer of p-type doped Ge, and a layer of intrinsic Ge disposed between the n-type doped and p-type doped layers of Ge; a first electrically conductive contact in electrical communication with the layer of n-type doped Ge; a second electrically conductive contact in electrical communication with the layer of p-type doped Ge; and a stretching actuator configured to stretch the mechanically stretchable substrate and the affixed p-i-n heterojunction structure to induce a biaxial tensile strain in the Ge. The induced biaxial tensile strain can be sufficiently large to transform the Ge into a direct-bandgap semiconductor material.

One embodiment of a method for inducing the emission of radiation from the tunable p-i-n diode comprises the steps of: stretching the mechanically stretchable substrate and the affixed p-i-n heterojunction structure using the stretching actuator to an extent sufficient to induce a biaxial tensile strain in the Ge; and applying a voltage across the tensilely strained p-i-n heterojunction structure, wherein radiation is emitted via electroluminescence.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 4(A) and (B) are top and side perspective views, respectively, of a strain tunable diode comprising a microfluidic cell as a stretching actuator.

DETAILED DESCRIPTION

Tunable p-i-n diodes comprising Ge heterojunction structures are provided. Also provided are methods for making and using the tunable p-i-n diodes. Tunability is provided by adjusting the tensile strain in the p-i-n heterojunction structure, which enables the diodes to emit radiation over a range of wavelengths, including wavelengths in the technologically significant 1.5 to 2.5 µm spectral range. As a result, the p-i-n diodes are useful in a wide variety of applications, including biological and chemical sensing, spectroscopy and free-space optical communications.

A basic embodiment of a tunable vertical p-i-n diode comprises a p-i-n heterojunction structure affixed to a mechanically stretchable substrate, wherein the p-i-n heterojunction comprises a layer of n-type doped Ge, a layer of p-type doped Ge, and an intrinsic Ge layer disposed between the n-type doped and p-type doped layers of Ge. The p-i-n diode further includes a stretching actuator configured to stretch the substrate and the Ge p-i-n heterojunction structure, thereby inducing a biaxial tensile strain in the heterojunction structure. The tensile strain lowers the direct energy bandgap of the Ge relative to the indirect energy bandgap. If sufficient tensile strain is applied (e.g., equal to or greater than approximately 2%), the Ge is transformed into a direct-bandgap semiconductor material with strongly enhanced radiation emission efficiency, capable of supporting population inversion and providing optical gain.

The p-i-n diodes can be induced to emit radiation by stretching the mechanically stretchable substrate, along with the overlying p-i-n heterojunction structure, thereby inducing a biaxial strain that changes the Ge band structure. If the biaxial tensile strain in the Ge is sufficiently large, the Ge is transformed into a direct-bandgap semiconductor material. A voltage applied across the strained p-i-n heterojunction structure can induce the emission of radiation via electroluminescence. The wavelengths of the emitted radiation can be adjusted by adjusting the amount of stretch and, therefore, the amount of tensile strain in the Ge.

The mechanically stretchable substrate is comprised of a material that is sufficiently compliant to allow it to be stretched to a degree sufficient to alter the energy band structure of the affixed Ge heterojunction structure, as described above, without undergoing a mechanical failure. Suitable materials for the mechanically stretchable substrate include elastomers, such as polyimide (PI). The substrate is generally provided as a thin film and may include an adhesive coating on its surface in order to facilitate the adhesion of the Ge p-i-n heterojunction structure. In some embodiments, the mechanically stretchable substrate has a thickness of no greater than about 1000 µm. For example, the thickness of this substrate can be in the range from about 20 µm to about 200 µm.

Figure 1:
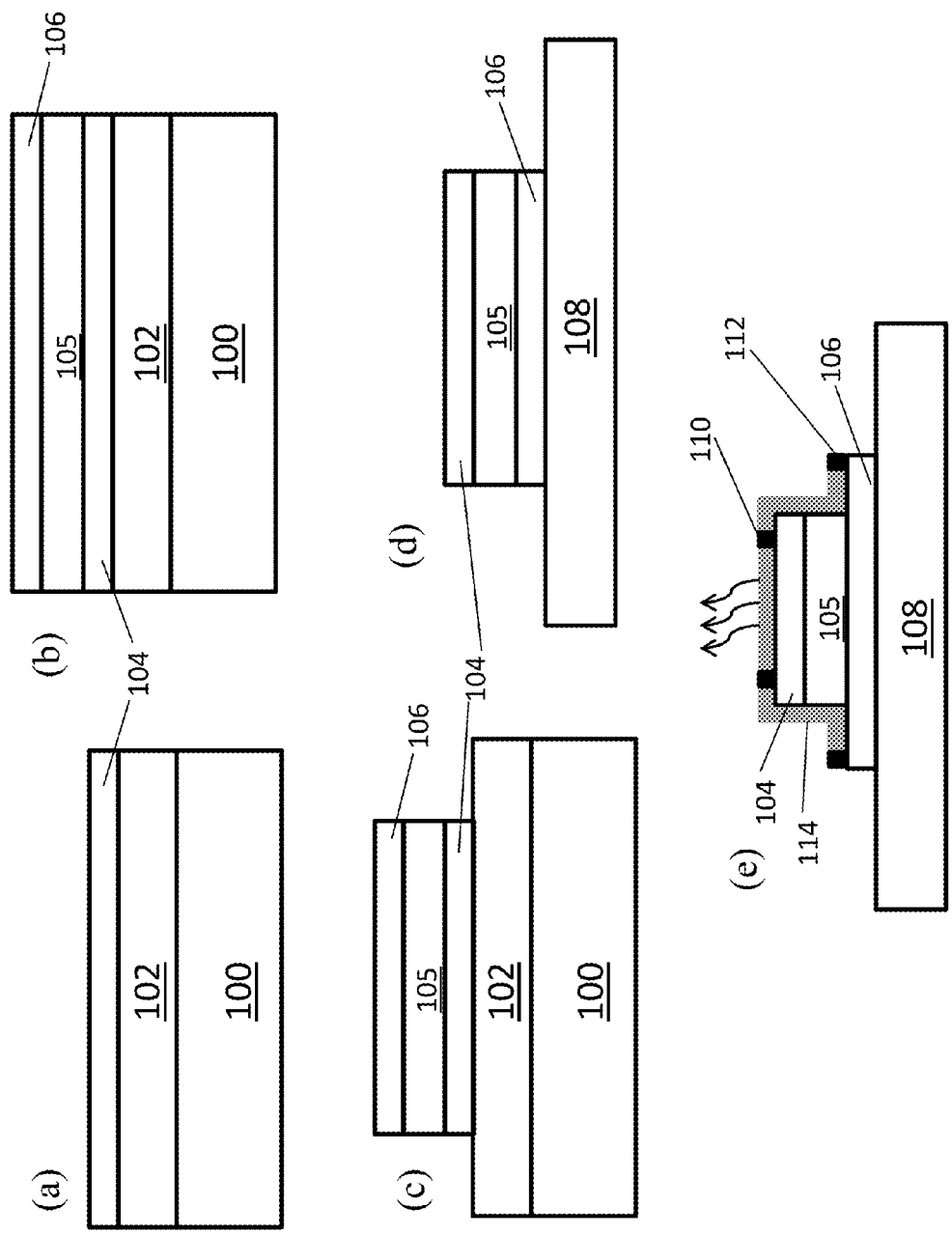
FIG. 1 is a schematic diagram showing a method of making a strain tunable diode having a germanium (Ge) p-i-n heterojunction structure.
Figure 2:
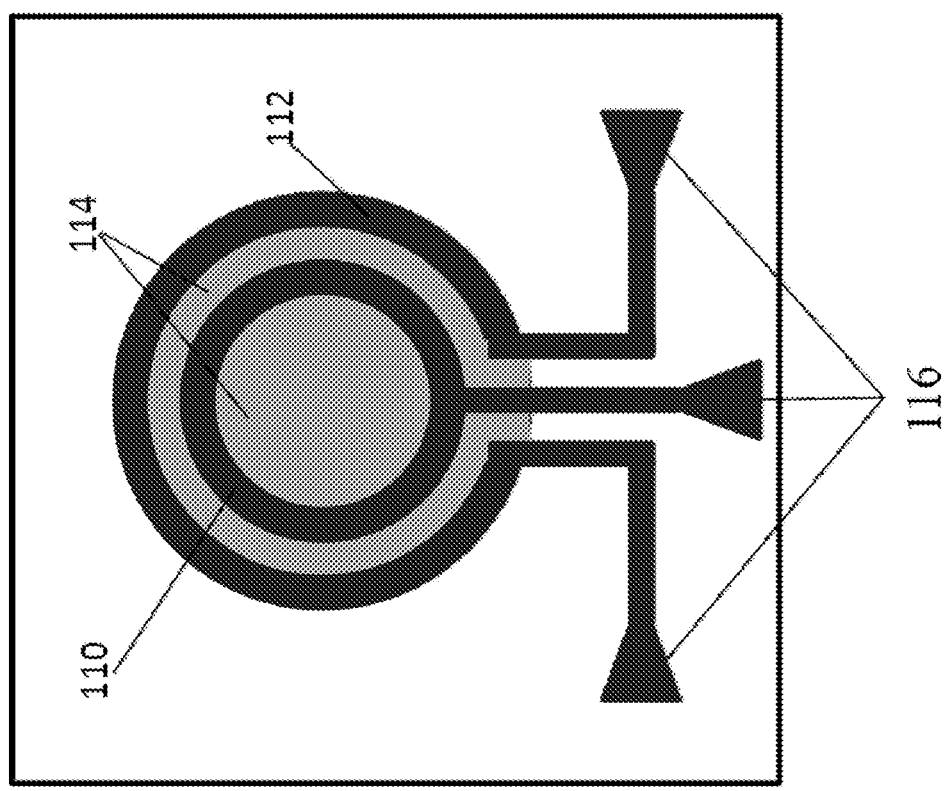
FIG. 2 is a top view of the finished diode of FIG. 1.

The Ge p-i-n heterojunction structure can be grown epitaxially on a growth substrate and subsequently transferred and bonded to the surface of the mechanically stretchable substrate. This process is illustrated schematically in FIG. 1. As shown in panel (a) of FIG. 1, fabrication can begin with a Ge-on-insulator (GOI) substrate comprising a handle substrate 100, a buried oxide layer 102, and a Ge device layer 104. Ge device layer 104 is used to form one of the doped layers in the p-i-n heterojunction structure. Therefore, this layer should be doped prior to the growth of the remaining p-i-n heterojunction layers. GOI materials having p-type and n-type doped Ge device layers are commercially available. A layer of intrinsic Ge 105 is then grown on doped Ge layer 104 and a layer of oppositely doped Ge 106 is then grown on intrinsic layer 105 to form the trilayered heterostructure shown in panel (b). One or more p-i-n heterojunction stacks can then be patterned via lithography to the desired size (panel (c)). Next, buried oxide layer 102 is selectively removed using, for example, a selective etch, thereby releasing the trilayered heterojunction structure and allowing it to settle onto handle substrate 100. The released p-i-n heterojunction structure is then transferred and affixed to a mechanically stretchable substrate 108 (panel (d)). Finally, electrically conducting contacts 110, 112 are deposited on doped layers 104 and 106 and a dielectric material 114, such as silicon dioxide, is deposited over the exposed surfaces. A top view of the resulting device is shown in FIG. 2. This view includes electrode bonding pads 116.

The p-i-n heterojunction structure is desirably quite thin. In some embodiments the thickness of the trilayered heterojunction structure is no greater than about 500 nm. This includes embodiments in which the p-i-n heterojunction structure has a thickness of no greater than about 100 nm. In order to increase recombination efficiency, the intrinsic layer of the p-i-n heterojunction structure may be thicker than either of the doped layers. By way of illustration, in some embodiments, the doped layers of the p-i-n heterojunction structure have a thickness in the range from about 10 to 100 nm, while the intrinsic layer has a thickness in the range from about 10 to about 400 nm.

The stretching actuator is a device that mechanically stretches the mechanically stretchable substrate and may come in a wide variety of forms. In some embodiments, the stretching actuator includes a cell that defines a cavity having at least one expandable surface, and a fluid source in communication with the cavity. When a fluid, which may be a liquid or a gas, is introduced from the fluid source into the cavity, the cavity expands, stretching the mechanically stretchable substrate and inducing a biaxial tensile strain in the Ge p-i-n heterojunction structure affixed thereto. Examples of p-i-n diodes incorporating this type of stretching actuator design are illustrated in FIGS. 3 and 4.

Figure 3:
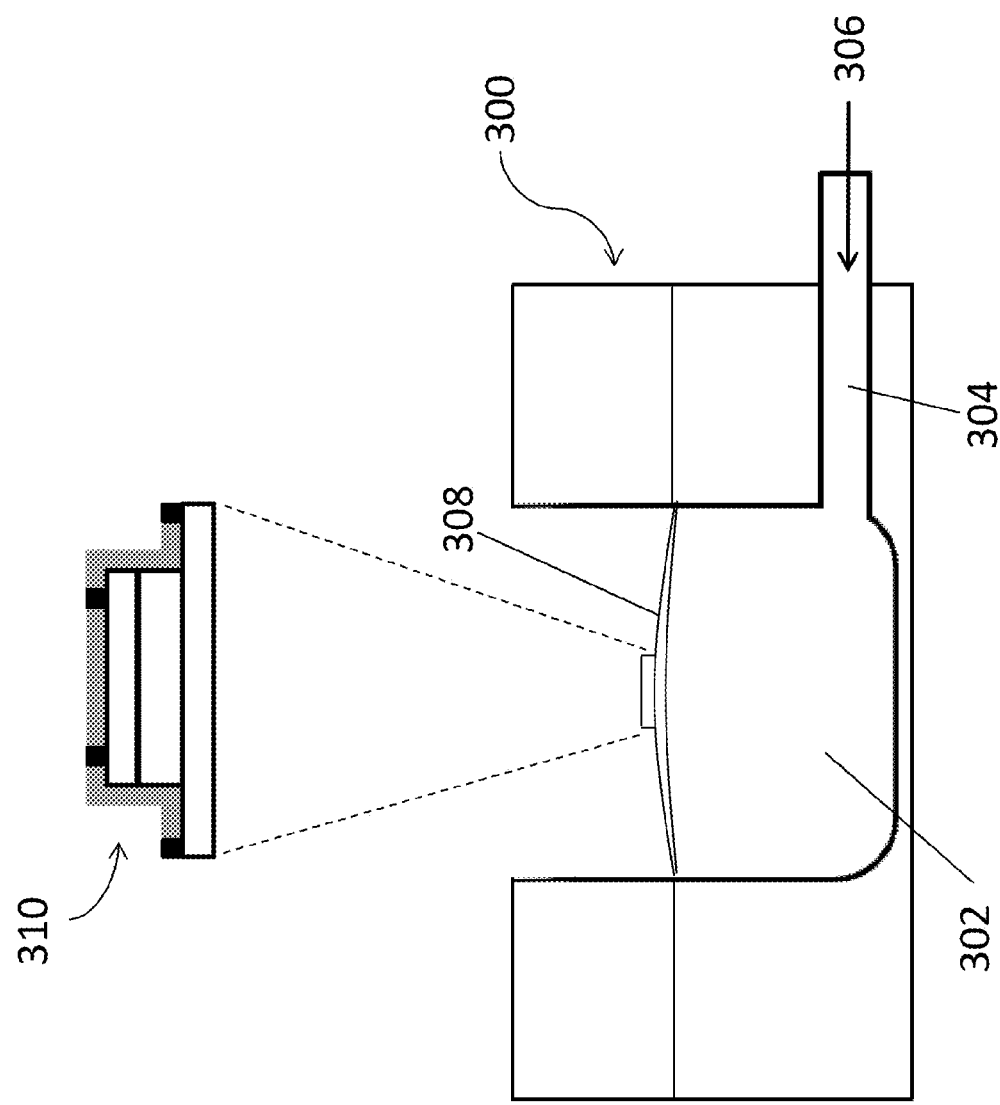
FIG. 3 is a schematic diagram showing a cross-sectional side view of a strain tunable diode comprising an air pressure cell as a stretching actuator.

In the diode of FIG. 3, the cell 300 defines a cavity 302. A channel 304 in communication with cavity 302 allows a compressed fluid 306 (e.g., compressed air) from a fluid source (not shown) to enter cavity 302. The top portion of cell 300 is comprised of mechanically stretchable substrate 308. Thus, in the design depicted in FIG. 3, an expandable surface of cavity 302 is provided by mechanically stretchable substrate 308. A Ge p-i-n heterojunction structure 310 is disposed on the upper surface of mechanically stretchable substrate 308. When a compressed fluid fills the cavity and exerts pressure against mechanically stretchable substrate 308, that substrate expands outwardly and creates a biaxial tensile strain in heterojunction structure 310. As a result, the energy band structure of the Ge is altered, until eventually at sufficiently high strains the Ge becomes a direct-bandgap semiconductor material.

In the diode of FIGS. 4(A) and (B), the cell 400 defines a closed cavity having an reversibly expandable top portion 405. A channel 404 is in communication with the cavity. The mechanically stretchable substrate 408 and the Ge p-i-n heterojunction structure 410 are disposed on top portion 405. When a compressed fluid fills the cavity and exerts pressure against elastic top portion 405, it expands outwardly in a dome shape. Substrate 408 expands outwardly along with top portion 405, creating a biaxial tensile strain in heterojunction structure 410. The thickness of the Ge is desirably sufficiently thin that the strain throughout its thickness is essentially uniform. As a result, the energy band structure of the Ge is altered, until eventually at sufficiently high strains the Ge becomes a direct-bandgap semiconductor material. In a variation of the diode depicted in FIGS. 4(A) and (B), the mechanically stretchable substrate provides the reversibly expandable top portion of the cavity, as in the diode of FIG. 3.

When a voltage is applied across the strained p-i-n heterojunction structures of FIGS. 3 and 4, they emit radiation, the wavelength of which depends on the degree of tensile strain in the Ge. Therefore, the emission wavelengths can be altered by altering the fluid pressure in the cavity.

EXAMPLE

This example illustrates the growth of a Ge p-i-n heterojunction structure and the transfer and bonding of the structure to a mechanically stretchable substrate. The fabrication scheme is shown schematically in FIG. 1.

Germanium-on-Insulator (GOI) growth substrates were purchased with p-type doping concentrations of $1 \times 10^{18}$ $cm^{-3}$ and with thicknesses ranging from 50 to 300 nm. Each growth substrate was cleaned with 5 minutes of sonication in acetone, followed by sonication in isopropanol and subsequently sonication in methanol. The growth substrate was then treated in a UV/ozone chamber at 55° C. The growth substrate was rinsed in deionized (DI) water for 5 minutes; after the rinse the growth substrate was dipped in HF, then water, then 10% HCl solution. The rinsing process was then repeated from the water rinse step.

Growth was performed in a low-pressure chemical vapor deposition chamber, but could have been performed by molecular beam epitaxy. The substrate was loaded into the chamber and flash heated to 700° C. to remove the hydrogen and chloride on the surface, then cooled. An intrinsic Ge layer was grown on the p-type doped Ge device layer of the GOI at a temperature of ~335° C. to a thickness of 45 nm. The growth substrate+intrinsic layer were again flash heated to 700° C. and cooled. The n-type Ge layer was subsequently grown on the intrinsic Ge layer at ~335° C. to a thickness of, typically, 27.5 nm.

Reactive ion etching was employed to etch the Ge template layer along the desired device boundaries, followed by a wet etch in a mixture of 49% hydrofluoric-acid and water solution (1/10) to dissolve the underlying $SiO_2$ layer. The released trilayered Ge heterojunction structures settled onto, and were weakly bonded to, the original Si handle wafer of the GOI. The Ge heterojunction structures were subsequently transferred and bonded onto 125-μm thick, flexible polyimide (PI) films (Kapton®, Du Pont) (i.e., a mechanically stretchable substrate), by using spin-on liquid PI as a glue layer and pressing the trilayer, still weakly bonded to the Si handle wafer, onto the PI film. The trilayer, now with the n-doped side down, adheres to the PI film and peels away from the Si handle wafer. After this transfer, the spin-on PI was cured at 350° C. and the Ge p-type layer was thinned from its original thickness (50-200 nm) to the desired thickness (~25 nm) using a wet etch with dilute hydrogen peroxide ($H_2O_2$) in water at 80° C. (etch rate ~0.9 nm/sec). This technique is referred to as dry transfer.

The Ge p-type doped device layer in the GOI also could have been thinned from its original thickness before growing the rest of the structure and UV or E-beam lithography could have been used to pattern the boundaries. Instead of removing the photoresist used for patterning, this layer could be used as an extra stressor to release the epitaxially grown structure. By using a wet etch in a 49% HF solution to dissolve the underlying $SiO_2$ layer and quickly submerging the Ge p-i-n heterojunction structure in DI water before it attaches to the Si handle wafer, the Ge p-i-n heterojunction structure can be released to become freely floating in water, and harvested using a wire loop to remove it from the water. Then, surface tension can be used to transfer it to a new substrate. Alternatively, the floating Ge p-i-n heterojunction structure could be harvested by any host substrate that is not rapidly soluble in water by inserting the host substrate underneath the structure and lifting it out of the water.

The released p-i-n heterojunction structure will initially be bonded to the mechanically stretchable substrate (i.e., the PI film) via hydrogen and van der Waals bonding. With an anneal at reasonably low temperatures (e.g., 30 min at 60-200° C.) the bond can be made so strong that it is not possible to remove the p-i-n heterojunction structure, irrespective of the mechanically flexible substrate material, assuming the substrate can withstand the 60-200° C. anneal temperatures. After annealing, the photoresist can be removed with acetone and isopropyl alcohol or by using a low-power oxygen plasma. This technique is referred to as wet transfer.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A vertical p-i-n diode comprising:
    a mechanically stretchable substrate;
    a vertical p-i-n heterojunction structure affixed to the mechanically stretchable substrate, the p-i-n heterojunction structure comprising a layer of n-type doped Ge, a layer of p-type doped Ge, and a layer of intrinsic Ge disposed between the n-type doped and p-type doped layers of Ge, wherein the combined thickness of the layer of n-type doped Ge, the layer of intrinsic Ge, and the layer of p-type doped Ge is no greater than about 100 nm;
    a first electrically conductive contact in electrical communication with the layer of n-type doped Ge;
    a second electrically conductive contact in electrical communication with the layer of p-type doped Ge; and
    a stretching actuator configured to stretch the mechanically stretchable substrate and the affixed vertical p-i-n heterojunction structure to induce a biaxial tensile strain in the Ge.

2. The diode of claim 1, wherein the induced biaxial tensile strain is sufficiently large to transform the Ge into a direct-bandgap semiconductor material.

3. The diode of claim 1, wherein the mechanically stretchable substrate comprises a polymeric elastomer.

4. The diode of claim 1, wherein the mechanically stretchable substrate has a thickness in the range from about 20 to about 1000 μm.

5. The diode of claim 1, wherein the stretching actuator comprises:
    a cell that defines a reversibly expandable cavity; and
    a fluid source in communication with the cavity and configured to introduce a fluid into the cavity under sufficient pressure to expand the cavity;
    wherein the p-i-n heterojunction structure is configured such that it undergoes a biaxial stretch as the cavity expands.

6. The diode of claim 5, wherein at least a portion of the cell that defines the cavity is comprised of the mechanically stretchable substrate.

7. The diode of claim 5, wherein at least a portion of the cell that defines the cavity is comprised of an elastic material that is configured to stretch as the cavity expands and further wherein the mechanically stretchable substrate is disposed on the elastic material.

8. A method of inducing the emission of radiation from a vertical p-i-n diode, the diode comprising:
    a mechanically stretchable substrate;
    a vertical p-i-n heterojunction structure affixed to the mechanically stretchable substrate, the vertical p-i-n heterojunction structure comprising a layer of n-type doped Ge, a layer of p-type doped Ge, and a layer of intrinsic Ge disposed between the n-type doped and p-type doped layers of Ge wherein the combined thickness of the layer of n-type doped Ge, the layer of intrinsic Ge, and the layer of p-type doped Ge is no greater than about 100 nm;
    a first electrically conductive contact in electrical communication with the layer of n-type doped Ge;
    a second electrically conductive contact in electrical communication with the layer of p-type doped Ge; and
    a stretching actuator configured to mechanically stretch the mechanically stretchable substrate and the affixed vertical p-i-n heterojunction structure, the method comprising:
    stretching the mechanically stretchable substrate and the affixed vertical p-i-n heterojunction structure using the stretching actuator to induce a biaxial tensile strain in the Ge; and
    applying a voltage across the tensilely strained vertical p-i-n heterojunction structure, wherein radiation is emitted via electroluminescence.

9. The method of claim 8, wherein the induced biaxial tensile strain is sufficiently large to transform the Ge into a direct-bandgap semiconductor material.

10. The method of claim 8, further comprising changing the wavelength range of the emitted radiation by changing the degree of biaxial tensile strain in the Ge.

11. The method of claim 8, wherein the radiation is emitted in the wavelength range from about 2.1 to 2.5 μm.

12. The method of claim 8, wherein the radiation is emitted in the wavelength range from about 1.5 to 2.1 μm.

\* \* \* \* \*